(12) United States Patent
Holtam et al.

(10) Patent No.: US 7,053,386 B1
(45) Date of Patent: May 30, 2006

(54) METHOD AND APPARATUS FOR IMPLANTING SEMICONDUCTOR WAFER SUBSTRATES

(75) Inventors: Tristan Richard Holtam, Sussex (GB); Richard Cooke, Worthing (GB); Peter Edwards, Sussex (GB); Geoffrey D. Paffett, Hampshire (GB); Lionel Marmie, Aussonne (FR)

(73) Assignee: Applied Materials, Inc., Santa Clara, CA (US)

( * ) Notice: Subject to any disclaimer, the term of this patent is extended or adjusted under 35 U.S.C. 154(b) by 505 days.

(21) Appl. No.: 10/182,804

(22) PCT Filed: Feb. 5, 2001

(86) PCT No.: PCT/GB01/00459

§ 371 (c)(1),
(2), (4) Date: Nov. 12, 2002

(87) PCT Pub. No.: WO01/57908

PCT Pub. Date: Aug. 9, 2001

(30) Foreign Application Priority Data

Feb. 4, 2000 (GB) .............................................. 0002669

(51) Int. Cl.
*G01B 11/14* (2006.01)

(52) U.S. Cl. .............................. 250/492.21; 250/492.2; 118/730

(58) Field of Classification Search ............ 250/492.21, 250/443.1
See application file for complete search history.

(56) References Cited

U.S. PATENT DOCUMENTS

| 4,733,087 A | | 3/1988 | Narita et al. |
| 5,389,793 A | * | 2/1995 | Aitken et al. .......... 250/492.21 |
| 5,456,561 A | | 10/1995 | Poduje et al. |
| 5,641,969 A | | 6/1997 | Cooke et al. |
| 5,989,342 A | * | 11/1999 | Ikeda et al. ................... 118/52 |

FOREIGN PATENT DOCUMENTS

| EP | 0 163 413 A2 | 12/1985 |
| GB | 2 191 335 A | 12/1987 |
| JP | 61-142752 A | 6/1986 |
| JP | 61-269843 A | 11/1986 |
| JP | 62-5549 A | 1/1987 |
| JP | 63-218140 A | 9/1988 |
| JP | 2-189850 A | 7/1990 |
| JP | 3-226953 | 10/1991 |
| WO | 97/45861 A1 | 12/1997 |

* cited by examiner

*Primary Examiner*—John R. Lee
*Assistant Examiner*—Phillip Johnston
(74) *Attorney, Agent, or Firm*—Boult Wade Tennant

(57) ABSTRACT

A gripper for loading wafers onto an implant wheel W and removing them from the wheel. The gripper having a substrate engaging mechanism (14) for engaging the substrate and a means for rotating this substrate engaging mechanism, such that wafers can be removed from the implant wheel, rotated to a second orientation and replaced without leaving the process chamber.

28 Claims, 8 Drawing Sheets

METHOD AND APPARATUS FOR IMPLANTING SEMICONDUCTOR WAFER SUBSTRATES

This application is the national phase under 35 U.S.C. § 371 of PCT International Application No. PCT/GB01/00459 which has an International filing date of Feb. 5, 2001, which designated the United States of America.

The present invention relates to a method and apparatus for implanting semiconductor wafer substrates.

U.S. Pat. No. 5,641,969 discloses just such a method and apparatus. In this document, an ion beam generator is arranged to project a beam of ions into an evacuated process chamber. A scanning arm is mounted within the process chamber, and a motor at one end of the scanning arm reciprocates it about a scan axis. At the opposite end of the arm an implant wheel is mounted so as to be rotatable about a wheel axis. The wheel has a number of discreet substrate supports disposed around its periphery. In use, with a substrate disposed on each substrate support, the wheel is rotated about the wheel axis so as to bring successive substrates into the path of the ion beam, while the arm is reciprocated to and fro about the scan axis to move the substrates progressively across the ion beam.

The wheel is further arranged to be rotatable through a limited angle about a tilt axis which is perpendicular to the scan axis. This tilts the entire wheel with respect to the ion beam so that, rather than being perpendicular to the ion beam, the substrates intersect the ion beam at a tilt angle. This can be useful to avoid shadowing when implanting into narrow crevices. Typically, a substrate will be implanted with no tilt angle, will then be tilted in a first direction about the tilt axis and further implanted, and will finally will be tilted in the opposite direction about the tilt axis for final implantation. Thus, while this is useful to avoid shadowing on facets of an orifice having a particular orientation, it does nothing for facets oriented perpendicular to this direction.

In order to implant into orifices with such perpendicular facets, the substrates are removed from the wheel by a gripper assembly, and transferred out of the process chamber via a load lock to the atmospheric wafer handling apparatus. In this handling assembly, they are rotated through 90° in a wafer orientation device, and are then transferred from this device through the load lock back into the process chamber and are returned to the implant wheel.

Not only is this a time consuming operation which substantially reduces throughput, but also the repeated handling of the substrates and their transfer to and from the atmospheric wafer handling apparatus introduces a higher risk of particulate contamination.

According to a first aspect of the present invention, there is provided an ion implanter having a process chamber into which an ion beam is projected; an implant wheel rotatably mounted within the process chamber so as to selectively move substrates mounted on the wheel through the ion beam; a reciprocably mounted scan arm on which the implant wheel is mounted, for progressively scanning substrates mounted on the wheel across the ion beam; a gripper within the process chamber having a gripper housing, a substrate engaging mechanism to selectively grip and release a substrate, and a rotating mechanism for rotating the substrate engaging mechanism with respect to the gripper housing about an axis perpendicular to the plane of a substrate held, in use, by the gripper.

According to another aspect of the invention, there is provided a gripper for transferring semiconductor wafer substrates between a load position within a process chamber of a semiconductor wafer substrate processing apparatus and an implant wheel within the process chamber, the gripper comprising a gripper housing; a substrate engaging mechanism for selectively gripping and releasing a substrate; and a rotating mechanism for rotating the substrate engaging mechanism with respect to the gripper housing about an axis perpendicular to the plane of a substrate held, in use, by the gripper.

With this arrangement, the orientation of a substrate can be changed simply by removing it from the implant wheel using the gripper, rotating the rotating mechanism, and returning it to the implant wheel. Thus, the number of wafer hand off operations is considerably reduced as compared to the prior art apparatus thereby significantly reducing the time to reorientate each wafer. The overall time to reorientate all of the wafers on an implant wheel is thus greatly reduced. Also, as the reorientation is carried out within the process chamber, there is no need to return the substrate to the atmospheric wafer handling apparatus, thereby further reducing the risk of contaminants.

The substrate engaging mechanism, preferably comprises a substantially annular member arranged to substantially surround a substrate held, in use, by the gripper. The substrate engaging mechanism may be a fully closed ring. However, it is preferable for the substrate engaging mechanism to be in the form of a broken ring which is arranged to surround, in use, the majority of the periphery of a substrate. This broken ring arrangement has advantages when the gripper moves a load position to pick up a substrate entering the process chamber as it allows the robot blade to pass through the gripper at the hand-off position hence speeding up wafer transfer time.

The substrate is rotated about an axis perpendicular to the plane of the substrate. If this axis of rotation does not pass through the centre of the substrate, the rotated substrate will be translated from its unrotated position. Knowing the relationship between the central axis of the substrate and the axis of rotation, it is possible to calculate a new position of the substrate and adjust all subsequent operations accordingly. However, it is simpler to rotate the substrate about its central axis, such that in its rotated position, the substrate has not been translated to a second position. For this reason, therefore, the rotating mechanism is preferably arranged to rotate the substrate engaging mechanism about an axis corresponding to the central axis of a substrate held, in use, by the gripper. In order to ensure that this is the case, calibration and adjustment of the position of the gripper fingers is required.

According to a further aspect of the invention, there is provided a method of implanting a semiconductor wafer substrate, the method comprising the steps of: mounting the substrate in a first orientation on an implant wheel in a process chamber; rotating the implant wheel to repeatedly pass the substrate in the first orientation through an ion beam; rotating the substrate in the process chamber with respect to the implant wheel about an axis perpendicular to the plane of the substrate to a second orientation; and rotating the implant wheel to repeatedly pass the substrate in the second orientation through the ion beam.

The method preferably further comprises the steps of removing the substrate from the implant wheel prior to rotating it to a second orientation; and returning the substrate to the implant wheel prior to the subsequent rotation of the wheel.

The rotating mechanism may be mounted onto the gripper housing using a conventional bearing such as a ball bearing race. However, such a bearing has a considerable number of components moving relatively to one another and will consequently tend to produce particulates. Furthermore, it would not be appropriate for use when the rotating mechanism has an incomplete ring structure.

Therefore, preferably, the rotating mechanism comprises an arcuate channel extending around a portion of the circumference of a substrate held, in use, by the gripper, the gripper housing being mounted within the arcuate channel, and having at least three channel engaging rollers, at least one of which is arranged to run along a face of the channel which faces radially outwardly, and at least one of which is arranged to run along a face of the channel which faces radially inwardly. This arrangement uses the structure of the gripper to provide a majority of the structure of the bearing. This allows the bearing to be made light in weight, and fitted within the envelope of a conventional gripper.

Preferably, a groove is provided in each face of the channel in which the rollers run, the rollers and the corresponding grooves being profiled so as to be complementary to one another.

Preferably, the gripper housing has a support in which the rollers are mounted, wherein the roller at at least one end of the support is separated from the remainder of the support by a cantilever spring. This may take the form of a cut-out portion within the support. This ensures that, as the support runs around the groove, any dimensional tolerances are absorbed by the cantilever spring arrangement while maintaining a positive contact between the rollers and faces.

This bearing assembly provides a further aspect of the invention which can be defined in the broadest sense as a bearing assembly comprising a channel and a slider slidably mounted within the channel, at least three channel engaging rollers, at least one of which is a first roller arranged to run, in use, along one side wall of the channel, and at least one of which is a second roller arranged to run, in use, along the other side wall, the position of at least one roller being adjustable laterally of the channel. This allows the rollers to be pretensioned against the side walls of the channel thereby providing a rigid bearing. Preferably, a groove is provided in each side wall in which the rollers run, the rollers and the corresponding grooves being profiled so as to be complementary to one another. Thus, the pretensioning of the rollers into the grooves provides support not only in the lateral direction of the channel, but also in a direction perpendicular to this direction and to the direction in which the slider runs along the channel.

Preferably, the roller at at least one end of the slider is separated from the remainder of the slider by a cantilever spring. This allows any dimensional tolerances between the slider and the channel to be readily absorbed while still maintaining a positive contact between the rollers and the side walls. Preferably, the slider and channel are arcuate.

In a conventional gripper, a number of substrate engaging fingers are mounted on a common linkage member, so as to be movable together between retracted and extended configurations. The movement of the gripper fingers is driven pneumatically. With the present invention, difficulties arise in supplying pneumatic gas to the link mechanism across a rotatable interface between the gripper housing and the rotating substrate engaging mechanism. Therefore, the gripper is preferably provided with a plurality of substrate engaging fingers spaced around the circumference of a substrate to be held, in use, each finger being coupled to an arcuate linkage member, the rotational movement of which causes all of the fingers to be driven synchronously between retracted and extended configurations, the linkage member being driven by a servo motor mounted on and rotatable with the substrate engaging mechanism. With this arrangement, there is no need to transfer pneumatic power across a rotating interface. The use of a servo motor allows the profile of the finger movement to be controlled, such that the engagement and disengagement with a substrate can occur gently in order to avoid substrate damage. This second advantage makes this arrangement of operating the gripper fingers a concept which has applications independent of the apparatus forming the first aspect of the present invention. In other words, this concept could be applied to a conventional gripper without a rotating mechanism.

Conventionally, the linkage member was supported in bearings which engage with the radially inner or outer edge of the linkage member. However, in the present case, in order to provide a more compact construction, the linkage member is preferably supported by a plurality of bearings, each of which cooperate with openings in the linkage.

Each finger is preferably pivotally mounted so as to be movable between engaged and retracted positions. The connection between each finger and the linkage member is preferably via a plate spring to provide a degree of resilience to the fingers to avoid substrate damage. Rather than being rigidly connected to the linkage member, each spring is preferably retained between a pair of rollers on the linkage member. This ensures that, each time that the fingers are moved, there is rolling, rather than sliding contact between the fingers and the linkage member thereby reducing the opportunity for particulate contaminant generation.

In order to ensure that a wafer is correctly retained by the gripper, a sensor can be used to verify that a wafer is in place. This conventionally takes the form of a single light emitter which projects a light directly towards a receiver both of which are mounted externally of the gripper. The light from the transmitter is blocked when a wafer is correctly positioned. Such a sensor has limited usefulness, as it can give a reading indicating that a wafer is correctly located, even if the wafer is not correctly seated, or if a broken wafer has been picked up.

According to a further aspect of the present invention, there is provided a finger for a gripper for transporting semiconductor substrates from one location to another within the process chamber of a semiconductor processing apparatus; the finger having a substrate engaging portion on which a substrate is received, in use, and being provided with a light source and a light sensor for detecting light from the light source, the source and sensor being angularly offset such that, with a substrate correctly held, in use, on the substrate engaging portion, light from the source is reflected from the surface of the substrate towards the sensor, and without a substrate correctly held by the substrate engaging portion, or with a substrate incorrectly held, substantially no light from the source is reflected towards the sensor.

Preferably, a gripper for transporting a semiconductor wafer substrate from one location to another within a process chamber of a semiconductor processing apparatus is provided with a number of these fingers, thereby allowing far greater versatility in the detection of a correctly mounted wafer. This should also reduce the possibility of a false positive when a broken wafer is picked up.

When a wafer is picked up by a gripper, any charge which has built up on the wafer is dissipated through the fingers. Therefore, preferably, when a gripper is provided with a number of fingers as described above, it is preferably also provided with one or more other fingers which are more electrically conductive than the fingers with the sensors. This ensures that any charge on the substrate is dissipated through these other fingers, thereby avoiding damage to the sensors.

An example of a method and apparatus in accordance with the present invention will now be described with reference to the accompanying drawings, in which.

The example to be described relates to a batch implantation apparatus which, in most senses, is conventional. Thus, the process chamber, the ion beam generator, the implant wheel, the atmospheric wafer handling apparatus, the load lock assembly and the transfer member for loading wafers into and out of the process chamber will have a conventional construction. Reference is made to U.S. Pat. No. 5,641,969, which is incorporated herein by reference where such an apparatus is described in detail. The conventional parts of this apparatus will not therefore be described in detail here.

The fact that the apparatus uses mainly conventional components is one of the advantages of this invention as all that is required to implement the invention is a new design of gripper. Thus, the invention can be implemented with minimal disruption to other parts of the machine, and is also suitable for being retrofitted on existing machines. The subsequent description will refer only to the gripper assembly.

Figure 1:
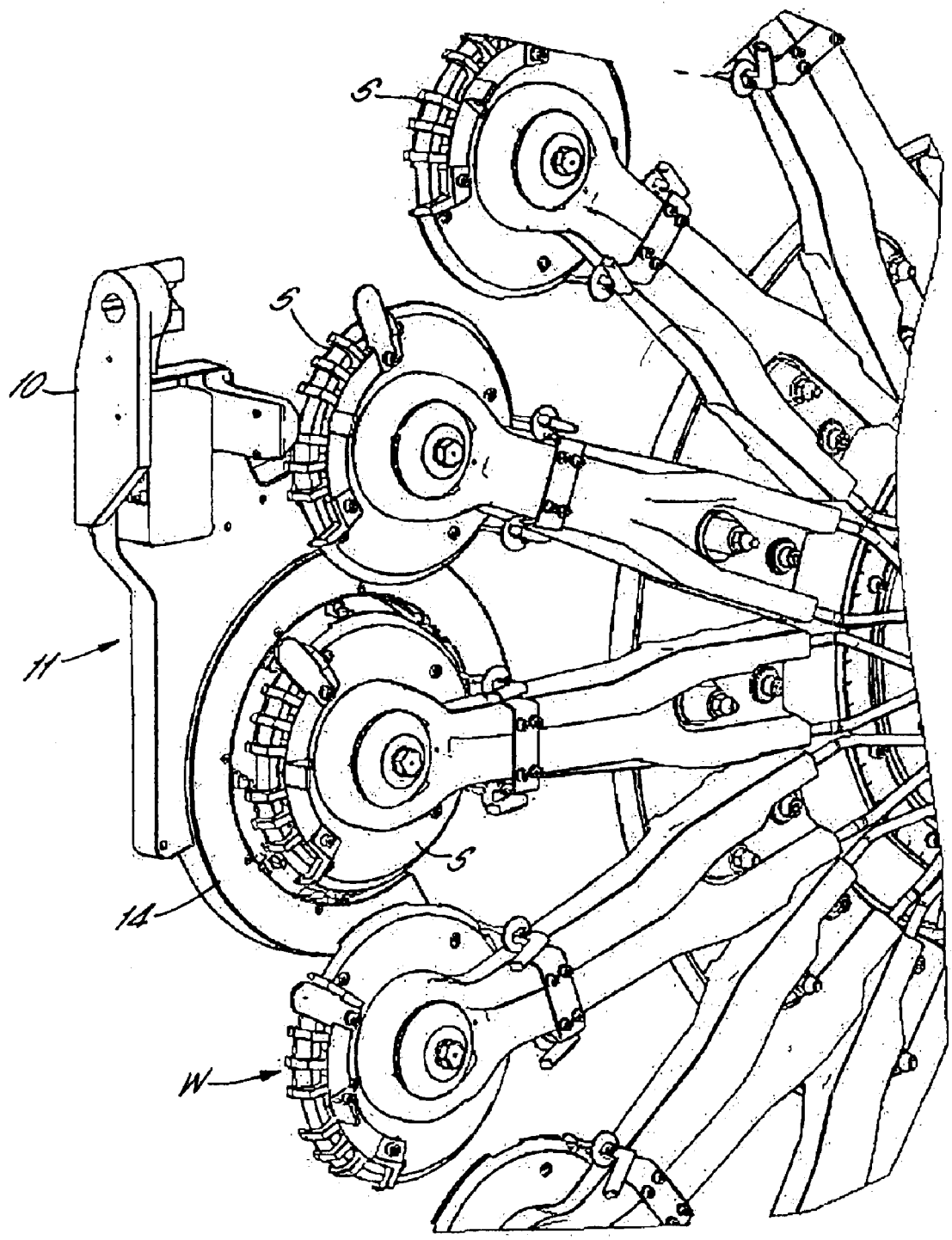
FIG. 1 is a perspective view showing how a gripper cooperates with a part of an implant wheel.
Figure 2:
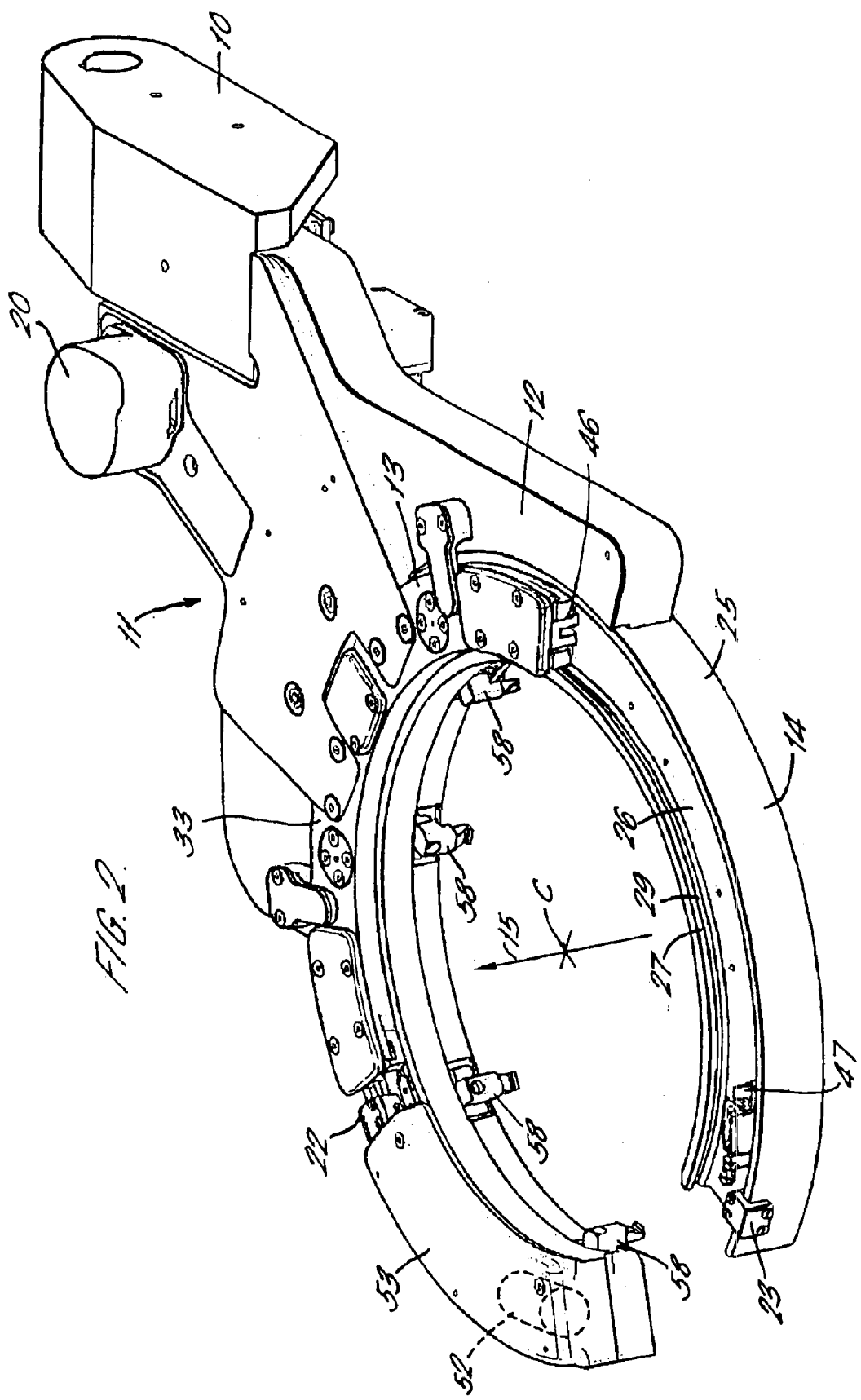
FIG. 2 is a perspective view of a gripper for use with the present invention.
Figure 3:
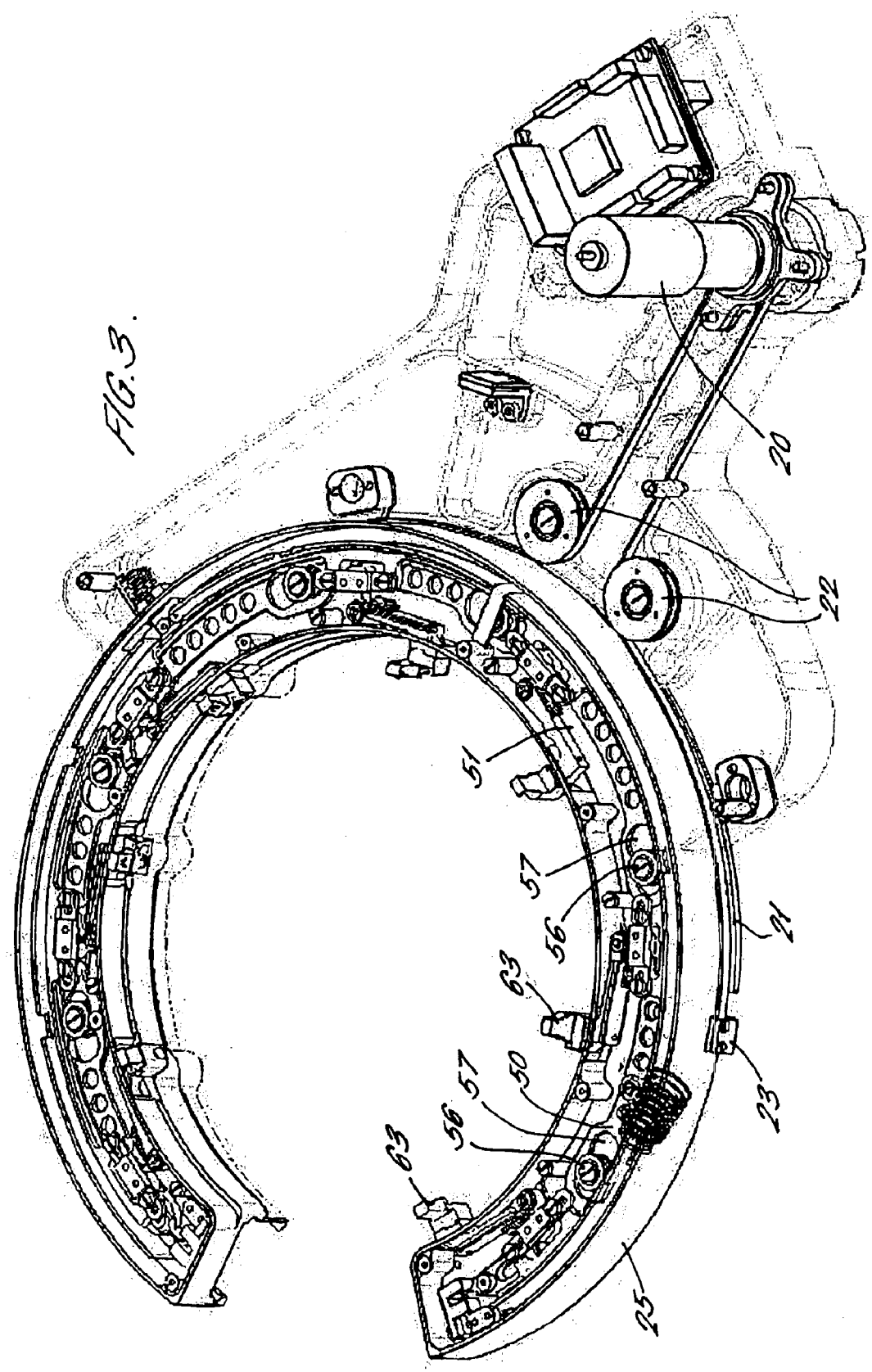
FIG. 3 is a perspective view from below with the lower part of the gripper removed.

The gripper assembly as shown in FIGS. 1 to 3 is mounted by a mounting portion 10 to a manipulator arm. The manipulator arm is of conventional construction and is arranged to move the gripper between a loading position and the implant wheel. The gripper can thus pick up a substrate which has entered the process chamber and carry it to an implant wheel W where it sets down the substrate at a substrate support position S on the implant wheel W in the position shown in FIG. 1. The gripper can also carry out the reverse operation of picking up a substrate from the implant wheel W and setting it down at the loading position, whereupon it can be removed from the implant chamber. The manipulator arm also allows the gripper to be rotated from the vertical configuration shown in FIG. 1 to a horizontal configuration as it moves between its two positions.

The gripper has a gripper housing 11 comprising a main housing 12 and an arcuate bearing housing 13 (described in greater detail below) rigidly fixed to the main housing 12. A rotatable substrate engaging mechanism 14 is supported by the bearing housing 13. The substrate engaging mechanism 14 is of an arcuate shape, subtending a central angle of approximately 300°. In other words, the substrate engaging mechanism is generally annular in shape with a portion broken away. This broken portion is important in allowing the gripper to pass through the blade assembly which loads the substrates into the process chamber. The substrate engaging mechanism is rotatable about a rotation axis 15 as shown in FIG. 2. This axis is perpendicular to the plane of a substrate held by the gripper, and passing through the centre C of such a substrate.

In order to drive the rotation of the substrate engaging mechanism, a servo motor 20 is provided. As best shown in FIG. 3, this drives a belt 21 via a system of pulleys 22. The belt 21 is attached at either end to opposite sides of the substrate engaging mechanism 14 by a pair of clamps 23. Thus, rotation of the motor 20 in one direction will cause the belt to pull on one of the clamps 23 and rotate the substrate engaging mechanism 14 in a first direction, while rotation of the motor 20 in the opposite direction will pull on the other of the clamps 23, thereby rotating the substrate engaging mechanism 14 in the opposite direction.

The way in which the substrate engaging mechanism 14 is supported to allow for this rotational movement will now be described with reference to FIGS. 2, 4 and 5. The substrate engaging mechanism 14 consists primarily of a ring 25 (in which as mentioned above is actually a broken ring shape). This ring 25 has in its upper face a channel 26 of U-shape cross section extending around the majority of its circumference. The U-shape channel 26 has a radially inner side wall 27 which faces radially outwardly and a radially outer side wall 28 which faces radially inwardly. A first groove 29 extends in a circumferential direction along the radially inner side wall 27, and a second groove 30 facing the first groove 29 extends in a circumferential direction along the radially outer side wall 28. The ring 25 is made from aluminium coated with Nuflon (TM). The first 29 and the second 30 grooves are then burnished to improve their hardness and are then coated with PETP.

The bearing housing 13 of the gripper housing 11 is provided with a number of bearing rollers which cooperate with the first 29 and second 30 grooves as will be described with particular reference to FIGS. 4 and 5. The bearing housing 13 primarily consists of an arcuate main support 33 in which a number of rollers are supported. As shown in FIG. 4, two inner rollers 34 and three outer rollers 35 are provided. It is believed that ultimately, three inner rollers 34 may be preferable to two.

Each of the rollers 34, 35 is mounted with a plurality of fasteners 36 in a machined port 37 within the main support 33. Each roller 34, 35 has a fixed portion 38 which is fixed to the port 37 and a rotatable portion 39 which is mounted to the fixed portion 38 via a suitable rotary bearing 40. The outer periphery 41 of the rotatable portion 39 is profiled so as to match the profile of the first 29 or second 30 groove in which it runs, and is coated with PETP so as to be compatible with the groove. The outer peripheries 41 of the inner rollers 34 are arranged to run within the first groove 29 in the radially inner sidewall 27 while the outer peripheries 41 of the outer rollers 35 are arranged to run within the second groove 30 in the radially outer wall 28. Covers 42 are fixed in place to cover the outer rollers 35.

The outer rollers 35 are provided with eccentric mountings 43, so that their position across the width of the channel 26 be set. Alternatively, or additionally, the eccentric mountings 43 could be provided on the inner rollers 34.

The arrangement of the rollers is such that an outer roller 35 is positioned at either end of the main support 33. A cut-out portion 44 is provided immediately adjacent to each of the outer rollers 35 mounted towards the end of the main support 33. The resilience of the material joining these ends to the remainder of the main support 33 around the cut-out portions 44 acts as a cantilever spring which compensates for any dimensional tolerances in the system. The eccentric mountings 43 allow the distance between the inner 34 and outer 35 rollers across the width of the channels to be adjusted. This ensures that the outer peripheries 41 of the rollers are always tightly engaged within their respective grooves 29, 30, thereby avoiding any play between the channel 26 and the support 33. Thus, the ring 25 is free to rotate with respect to the gripper housing 11, but is also rigidly supported.

Mounted to each end of the main support 33 is a light emitter/sensor pair 46 this comprises a light emitter which transmits light directly towards a light sensor. Each of these pairs 46 cooperates with a flag 47 mounted on the ring 25. Thus, when the substrate has been rotated by the desired angle, the flag 47 will be between the emitter and sensor, thus preventing light from the emitter reaching the sensor. In fact, the substrate engaging mechanism 14 is driven to the desired position under the control of the servomotor 20 and the emitter/sensor pair 46 and flag 47 arrangement is used firstly to calibrate the setting for the servomotor, and secondly as a drift monitor to ensure that the servomotor is correctly rotating the substrate to the desired position.

The substrate engaging mechanism 14 will now be described in detail with particular reference to FIG. 3. The substrate engaging mechanism 14 includes an arcuate linkage member 50 which is retained within an arcuate channel 51 in the lower side of the ring 25. The linkage member 50 is shorter than the channel 51 so as to allow space for the linkage member to be rotated within the channel.

The linkage member 50 is driven by a second servomotor 52 mounted on the upper side of the ring 25 and covered by cover 53. A drive shaft of the second servomotor 52 extends through an orifice in the ring 25 and engages via suitable gearing with the linkage member 50. The linkage member 50 is supported within the channel 51 by six rotary bearing elements 56 fixed in the channel 51. Each of these bearing elements 56 is within a short arcuate groove 57 in the linkage member 50 thus allowing the linkage member to be rotated about the axis 15 to the extent allowed for by the grooves 57.

Figure 6:
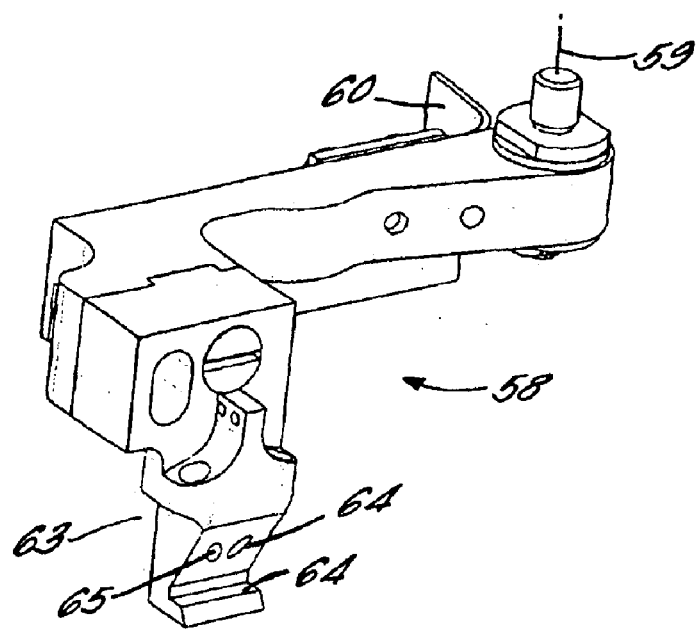
FIG. 6 is a perspective view of a finger assembly.

A number of finger assemblies 58 as best shown in FIG. 6 are positioned at regularly spaced intervals around the circumference of the substrate. These assemblies 58 are pivotally mounted to the ring 25 about a pivot axis 59. Each finger assembly 58 has a right angled plate spring 60 which is retained between a pair of rollers mounted to the linkage member 50. Spaced from a pivot axis 59 is a finger element 63 which is arranged to support the edge of a substrate.

Upon rotation of the linkage member 50, the plate springs 60 of the finger assemblies 58 are moved by the rollers and transmit the motion to all of the finger elements 63 simultaneously causing them to be moved towards or away from a substrate by a pivotal motion about pivot axis 59.

The linkage member 50 is provided similar emitter/sensor/flag arrangement as the main support 33 in order to calibrate and monitor the operation of the finger elements 63. The position of each of the finger elements 63 is also adjusted separately during the calibration process in order to centre the substrate engaging mechanism 33 so that when it is rotated on the bearing housing 13, the substrate is rotated about its central axis.

Figure 4:
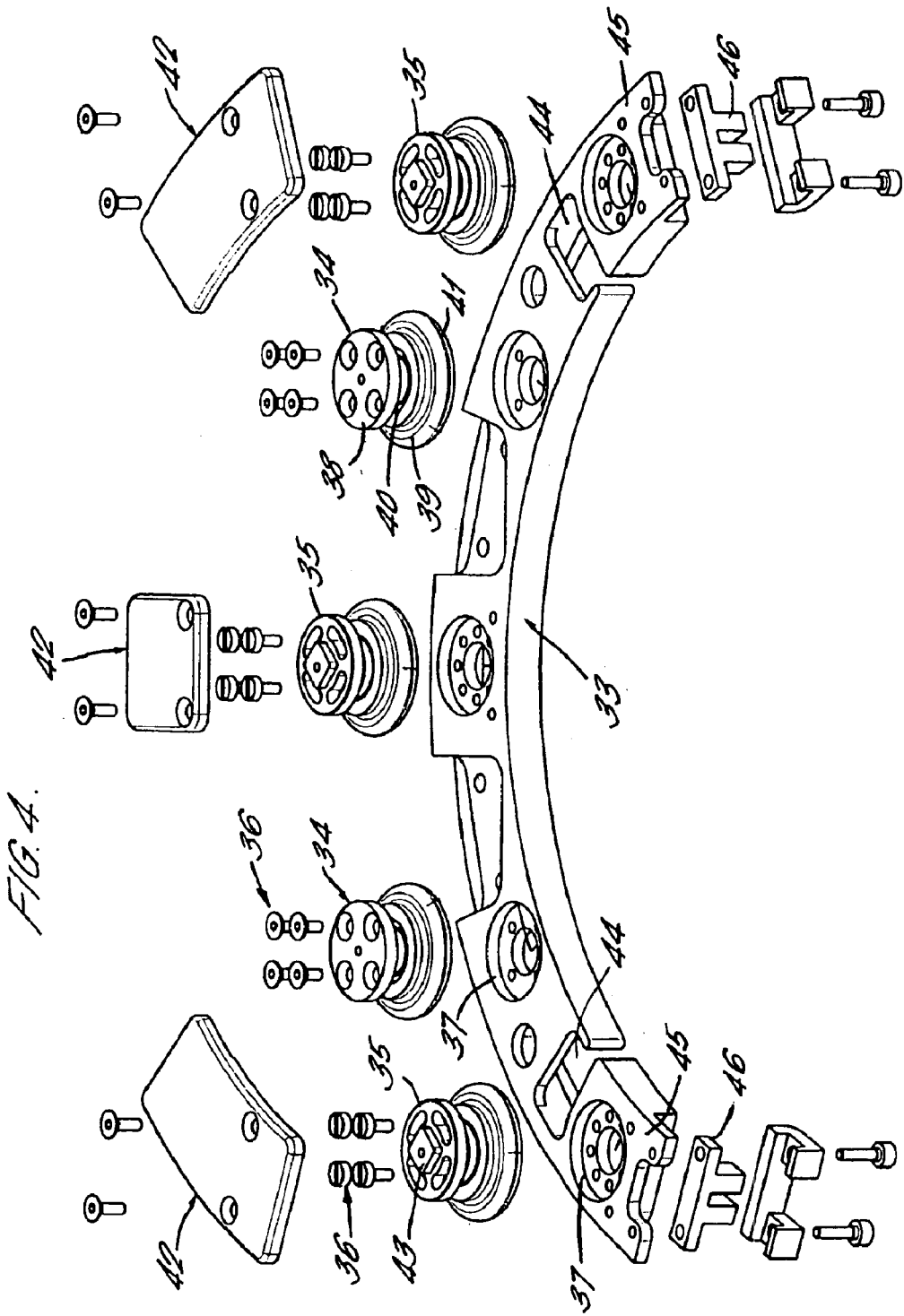
FIG. 4 is an exploded view of a part of the bearing assembly.
Figure 5:
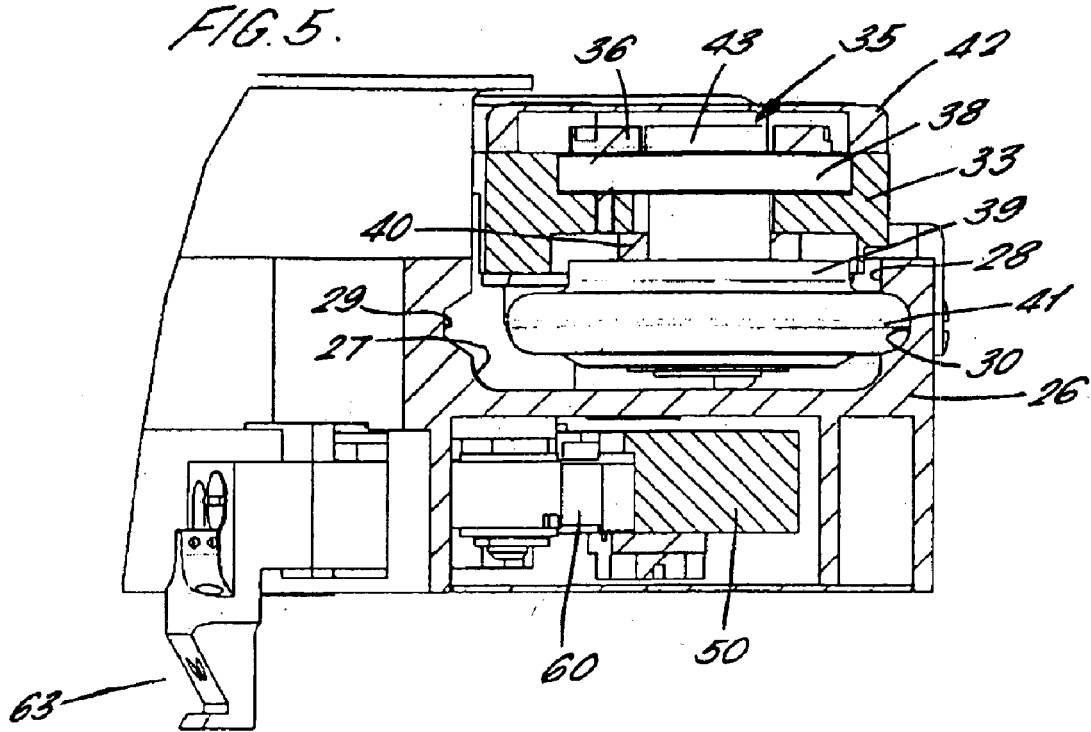
FIG. 5 is a cross section through part of the bearing assembly.
Figure 7:
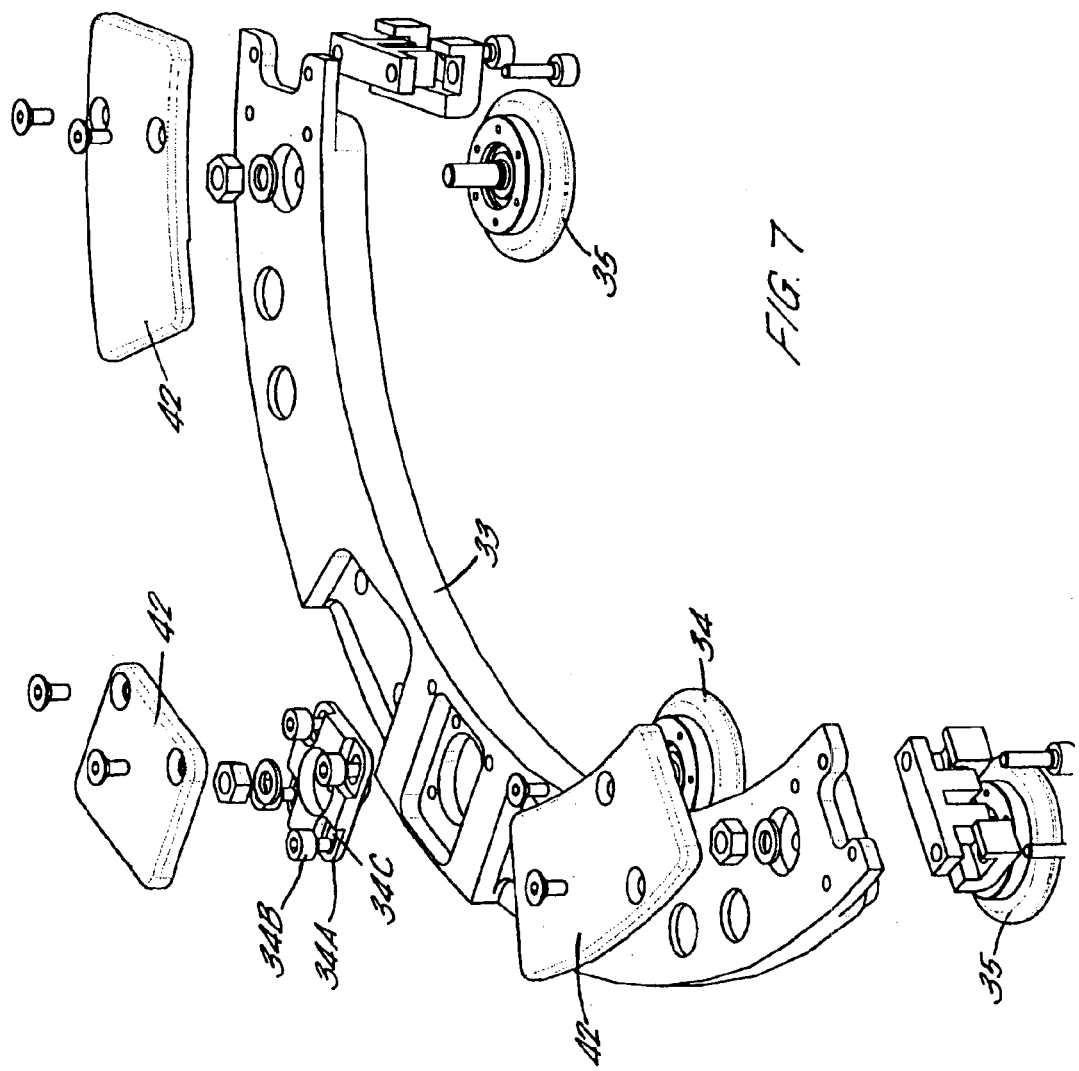
FIG. 7 is a view similar to FIG. 4 of an exploded view of part of an alternative bearing assembly.

The structure of the bearing assembly of FIG. 7 is generally similar to that of FIG. 4 and the same reference numerals will be used to designate the corresponding components. The arcuate support 33 shown in FIG. 7 differs essentially from that shown in FIG. 4 in that it has only three, rather than five rollers 34, 35. The roller 34 is adjustable radially by means of a bracket 34A and a plurality of screws 34B which pass radially extending slots 34C in the bracket 34A. Further, the cut-out portions 44 of FIG. 4 are absent from FIG. 7.

Figure 8:
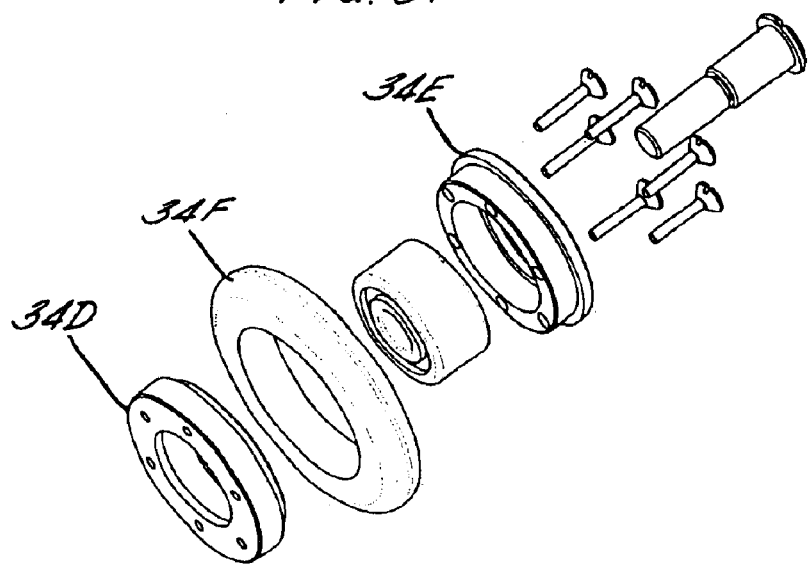
FIG. 8 is an exploded view of one of the rollers used in the bearing assembly of FIG. 7.
Figure 9:
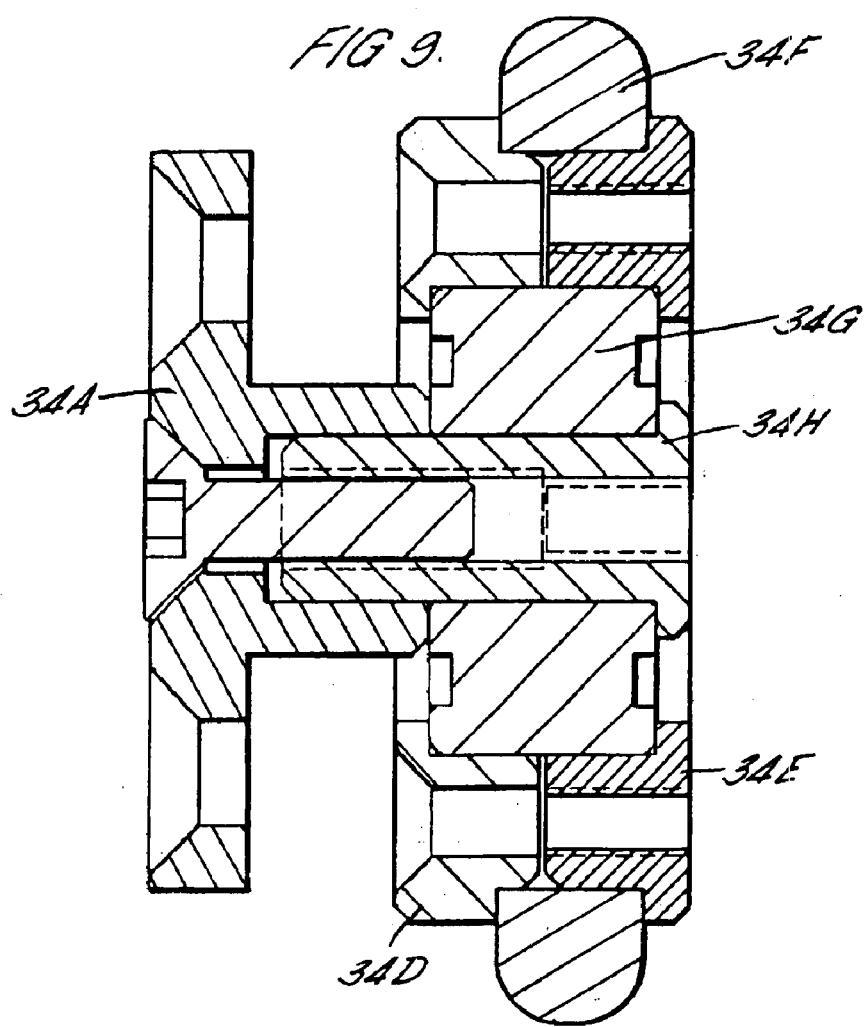
FIG. 9 is a cross-section through the roller of FIG. 8.
Figure 12:
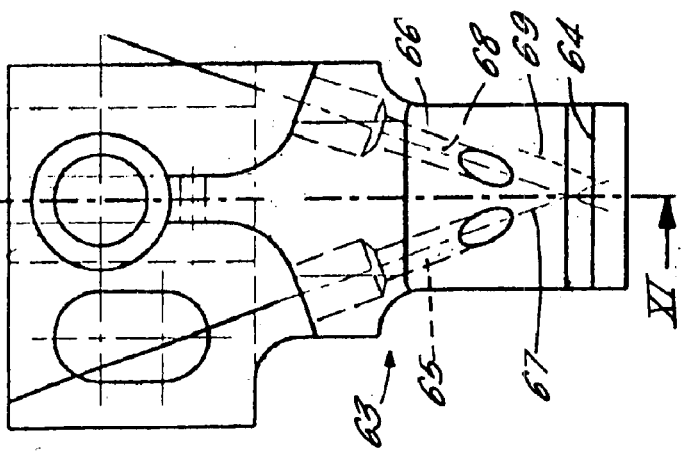
FIG. 12 is a section through line XII—III in FIG. 6C.
Figure 11:
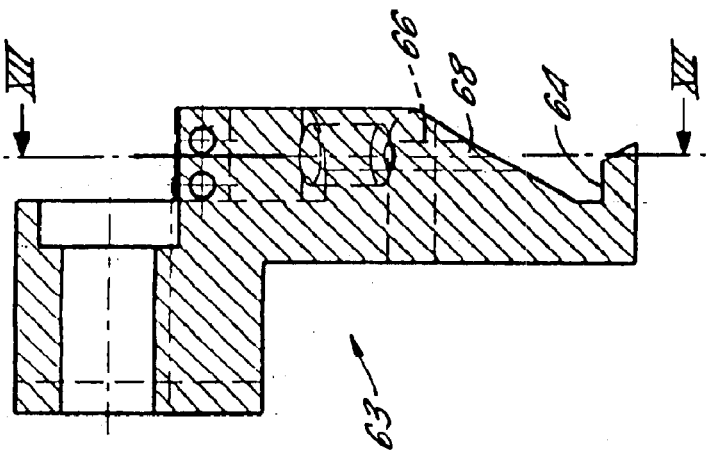
FIG. 11 is a section through line XI—XI in FIG. 6B.
Figure 10:
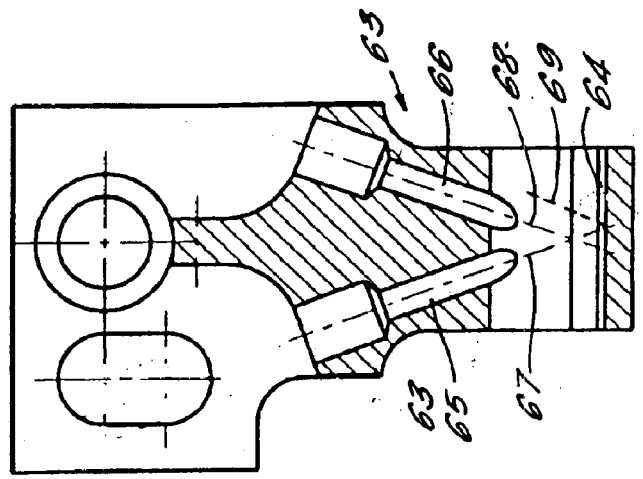
FIG. 10 is a plan of a gripper finger.

The roller assembly is shown in FIGS. 8 and 9. The roller comprises a two-part housing 34D and 34E. A rigid tyre 34F surrounds this two-part housing. Within the housing 32D, 32E is a bearing 34G which is an axial angular contact ball bearing, double acting which is commercially available and will not be described in detail here. The inner race of the bearing 34G is clamped by an internal collar 34A.

The sensing arrangement provided on each finger 63 will now be described with reference to FIG. 6 and FIGS. 10 to 12.

Each of the finger elements has a lip 64 on which a substrate is supported. An LED emitter (not shown) is positioned within a port 65 to emit light in the direction of the axis 67 of the port 65, while a photo diode receiver (not shown) is mounted in a port 66 to receive light travelling along the axis 68 of port 66. It will be appreciated that, with no wafer present, any light from the emitter which is reflected by the lip 64 will travel in the direction shown by line 69 and will miss the port 66 and not be transmitted to the receiver. On the other hand, when a substrate is correctly located on the lip 64, the substrate will be at the intersection of the axes 67, 68 and light from the emitter will be reflected directly to the receiver. If a wafer has not been correctly seated, the light from the emitter will again not be reflected to the receiver but in some other direction, and the apparatus is able to detect that the wafer is incorrectly seated.

When a number of the fingers are provided with the sensors as shown in FIGS. 6 and 10 to 12, readings can be taken from a number of locations spaced around the circumference of the substrate to provide several independent indications of the position of the wafer. In order to prevent any charge which has built up on the substrate from damaging a sensor, certain of the finger elements 63 which are not provided with a sensor, are made more electrically conductive than those provided with the sensors (for example those with sensors can be made of PETP, while those without can be made of PEIESD 410). This ensures that any charge is preferentially dissipated through the more electrically conductive fingers.

The operation of the apparatus will now be described. Initially, the gripper will take a wafer which has been loaded into the process chamber and transfer it to the implant wheel in the usual way. Implanting then occurs with the wafer initially in an untilted configuration. The implant head is then tilted in one direction about its tilt axis for further implanting and is subsequently tilted in the opposite direction about the tilt axis for further implantation.

The implant wheel is then stopped, and the gripper is to driven a wafer hand-off position at which it picks a substrate from a substrate support on the implant wheel by being moved into position and by operation of the second motor 52 to drive the finger elements 63 into an extended position in which they engage with the edges of the substrate.

At this time, readings are taken from the receivers in the ports 66 in order to confirm that a substrate has been correctly gripped.

The gripper is then retracted a short distance from the substrate support on the implant wheel and the servo motor 20 is then operated to drive the substrate engagement mechanism 14, consisting of the ring 25 and all of the components mounted to it, through an angle of 90° about rotation axis 15. The gripper then returns the wafer to the hand-off position, where the second motor 52 causes the finger elements 63 to be retracted thus releasing the substrate to the implant wheel.

This process is repeated for each substrate mounted on the implant wheel in turn. Once the process has been completed, the implant wheel is again operated to implant the substrate with no angle of tilt, and with the two opposite angles of tilt as before. This time, however, because the substrates have been rotated through 90° with respect to the implant wheel, the direction of the implant on a tilted substrate will be offset by 90° about the rotation axis 15 with respect to the previous tilted implant process.

At the end of this process, the gripper again approaches the implant wheel and transfers each substrate in turn from the wheel to a position in which it can be removed from the process chamber.

In a conventional apparatus where the wafers have to be withdrawn from the process chamber to the atmospheric wafer handling apparatus for reorientation, the throughput of an apparatus operating in this way is typically 80 substrates per hour. With the present invention, this can be increased to around 120 substrates per hour.

The present invention also allows for the possibility of a chain implant. For this to occur, the implant wheel remains untilted throughout the entire implant process. However, following an initial implant step, each substrate is removed from the implant wheel and turned through 90° before a further implant step. These turning and implant steps can be repeated twice more so that the substrate is implanted in total in four positions each offset by 90° with respect to the one before.

The apparatus can, of course, readily be adapted to rotate the substrate through angles other than 90° if so desired.

What is claimed is:

1. An ion implanter having a process chamber into which an ion beam is projected;
    an implant wheel rotatably mounted within the process chamber so as to selectively move substrates mounted on the wheel through the ion beam;
    a reciprocably mounted scan arm on which the implant wheel is mounted, for progressively scanning substrates mounted on the wheel across the ion beam;
    a gripper within the process chamber having a gripper housing, a substrate engaging mechanism to selectively grip and release a substrate, and a rotating mechanism for rotating the substrate engaging mechanism and a substrate gripped thereby with respect to the gripper housing about an axis perpendicular to the plane of a substrate held, in use, by the gripper.

2. An apparatus according to claim 1, wherein the substrate engaging mechanism comprises a substantially annular member arranged to substantially surround a substrate held, in use, by the gripper.

3. An apparatus according to claim 2, wherein the substrate engaging mechanism comprises a broken ring which is arranged to surround, in use, the majority of the periphery of a substrate.

4. An apparatus according to any one of the preceding claims, wherein the rotating mechanism is arranged to rotate the substrate engaging mechanism about an axis corresponding to the central axis of a substrate held, in use, by the gripper.

5. An apparatus according claim 1, wherein the rotating mechanism comprises an arcuate channel extending around a portion of the circumference of a substrate held, in use, by the gripper, the gripper housing being mounted within the arcuate channel, and having at least three channel engaging rollers, at least one of which is arranged to run along a face of the channel which faces radially outwardly, and at least one of which is arranged to run along a face of the channel which faces radially inwardly.

6. An apparatus according to claim 5, wherein a groove is provided in each face of the channel in which the rollers run, the rollers and the corresponding grooves being profiled so as to be complementary to one another.

7. An apparatus according to claim 5 or claim 6, wherein the gripper housing has a support in which the rollers are mounted, wherein the roller at at least one end of the support is separated from the remainder of the support by a cantilever spring.

8. A gripper for transferring semiconductor wafer substrates between a load position within a process chamber of a semiconductor wafer substrate processing apparatus and an implant wheel within the process chamber, the gripper comprising a gripper housing; a substrate engaging mechanism for selectively gripping and releasing a substrate; and a rotating mechanism for rotating the substrate engaging mechanism and a substrate gripped thereby with respect to the gripper housing about an axis perpendicular to the plane of a substrate held, in use, by the gripper.

9. A gripper according to claim 8, further provided with a plurality of substrate engaging fingers spaced around the circumference, of a substrate to be held, in use, each finger being coupled to an arcuate linkage member, the rotational movement of which causes all of the fingers to be driven synchronously between retracted and extended configurations, the linkage member being driven by a servo motor mounted on and rotatable with the substrate engaging mechanism.

10. A gripper according to claim 9, wherein the linkage member is supported by a plurality of bearings, each of which cooperate with openings in the linkage.

11. A gripper according to claim 9 or claim 10, wherein each finger is pivotally mounted so as to be movable between engaged and retracted positions.

12. A gripper according to claim 9, wherein the connection between each finger and the linkage mechanism is via a plate spring to provide a degree of resilience to the fingers to avoid substrate damage.

13. A gripper according to claim 12, wherein each spring is retained between a pair of rollers on the linkage member.

14. A gripper according to claim 8, comprising a plurality of fingers for engaging the substrate, at least one finger having a substrate engaging portion on which a substrate is received, in use, and being provided with a light source and a light sensor for detecting light from the light source, the source and sensor being angularly offset such that, with a substrate correctly held, in use, on the substrate engaging portion, light from the source is reflected from the surface of the substrate towards the sensor, and without a substrate correctly held by the substrate engaging portion, or with a substrate incorrectly held, substantially no light from the source is reflected towards the sensor.

15. A gripper according to claim 14, which is further provided with one or more other fingers which are more electrically conductive than the fingers with the sensors.

16. A method of implanting a semiconductor wafer substrate, the method comprising the steps of:
    mounting the substrate in a first orientation on an implant wheel in a process chamber;
    rotating the implant wheel to repeatedly pass the substrate in the first orientation through an ion beam;
    halting rotation of the implant wheel;
    engaging the substrate with a gripper to remove the substrate from the implant wheel;

rotating the substrate in the gripper about an axis perpendicular to the plane of the substrate;

remounting the rotated substrate on the implant wheel in a second orientation; and rotating the implant wheel again to repeatedly pass the substrate in the second orientation through the ion beam.

17. A bearing assembly comprising a channel and a slider slidably mounted within the channel, at least three channel engaging rollers, at least one of which is a first roller arranged to run, in use, along one side wall of the channel, and at least one of which is a second roller arranged to run, in use, along the other side wall, the position of at least one roller being adjustable laterally of the channel.

18. An assembly according to claim 17, wherein a groove is provided in each side wall in which the rollers run, the rollers and the corresponding grooves being profiled so as to be complementary to one another.

19. An assembly according to claim 17 or claim 18, wherein the roller at at least one end of the slider is separated from the remainder of the slider by a cantilever spring.

20. An assembly according to claims 17, wherein the slider and channel are arcuate.

21. A gripper for manipulating a substrate, the gripper being provided with a plurality of substrate engaging fingers spaced around the circumference of a substrate to be held, in use, each finger being coupled to an arcuate linkage member, the rotational movement of which causes all of the fingers to be driven synchronously between retracted and extended configurations, the linkage member being driven by a servo motor mounted on and rotatable with the substrate engaging mechanism.

22. A gripper according to claim 21, wherein the linkage member is supported by a plurality of bearings, each of which cooperate with openings in the linkage.

23. A gripper according to claim 21 or claim 22, wherein each finger is pivotally mounted so as to be movable between engaged and retracted positions.

24. A gripper according to claim 21, wherein the connection between each finger and the linkage mechanism is via a plate spring to provide a degree of resilience to the fingers to avoid substrate damage.

25. A gripper according to claim 24, wherein each spring is retained between a pair of rollers on the linkage member.

26. A finger for a gripper for transporting semiconductor substrates from one location to another within the process chamber of a semiconductor processing apparatus; the finger having a substrate engaging portion on which a substrate is received, in use, and being provided with a light source and a light sensor for detecting light from the light source, the source and sensor being angularly offset such that, with a substrate correctly held, in use, on the substrate engaging portion, light from the source is reflected from the surface of the substrate towards the sensor, and without a substrate correctly held by the substrate engaging portion, or with a substrate incorrectly held, substantially no light from the source is reflected towards the sensor.

27. A gripper for transporting a semiconductor wafer substrate from one location to another within a process chamber of a semiconductor processing apparatus is provided with a number of fingers according to claim 26.

28. A gripper according to claim 27, which is further provided with one or more other fingers which are more electrically conductive than the fingers with the sensors.

* * * * *